(12) United States Patent
Benzel et al.

(10) Patent No.: US 7,494,839 B2
(45) Date of Patent: Feb. 24, 2009

(54) METHOD FOR MANUFACTURING A MEMBRANE SENSOR

(75) Inventors: Hubert Benzel, Pliezhausen (DE);
Frank Schaefer, Tuebingen (DE);
Simon Armbruster, Reutlingen (DE);
Gerhard Lammel, Teubingen (DE);
Christoph Schelling, Reutlingen (DE);
Joerg Brasas, Walddorfhaeslach (DE)

(73) Assignee: Robert Bosch GmbH, Stuttgart (DE)

( * ) Notice: Subject to any disclaimer, the term of this patent is extended or adjusted under 35 U.S.C. 154(b) by 190 days.

(21) Appl. No.: 11/011,888

(22) Filed: Dec. 13, 2004

(65) Prior Publication Data

US 2005/0181529 A1 Aug. 18, 2005

(30) Foreign Application Priority Data

Dec. 16, 2003 (DE) ................................. 103 58 859
Jul. 24, 2004 (DE) ...................... 10 2004 036 032

(51) Int. Cl.
*H01L 21/00* (2006.01)
(52) U.S. Cl. .................. 438/53; 257/419; 257/E21.305
(58) Field of Classification Search .................. 438/53; 257/419, E21.305
See application file for complete search history.

(56) References Cited

U.S. PATENT DOCUMENTS

| 4,766,666 A | * | 8/1988 | Sugiyama et al. | 29/621.1 |
| 5,242,863 A | * | 9/1993 | Xiang-Zheng et al. | 438/53 |
| 5,445,991 A | * | 8/1995 | Lee | 216/2 |
| 5,510,276 A | * | 4/1996 | Diem et al. | 438/53 |
| 6,376,291 B1 | * | 4/2002 | Barlocchi et al. | 438/175 |
| 6,743,654 B2 | * | 6/2004 | Coffa et al. | 438/52 |
| 2003/0116813 A1 | * | 6/2003 | Benzel et al. | 257/414 |

FOREIGN PATENT DOCUMENTS

| DE | 100 30 352 | 1/2002 |
| DE | 100 32 579 | 1/2002 |
| DE | 101 38 759 | 3/2003 |

OTHER PUBLICATIONS

Steiner, P. et al., "Mikrostrukturierung mit porösem Silizium," ("Microconstruction with Porous Silicium"), Mar. 1994, pp. 285-290, ITG-Fachberichte, VDE Verlag, Berlin, Germany.
"Low-pressure vapor-phase epitaxy of silicon on porous silicon," *Material Letters* 94 (1988), by L. Vescan et al.

* cited by examiner

*Primary Examiner*—Douglas M Menz
*Assistant Examiner*—Steven J. Fulk
(74) *Attorney, Agent, or Firm*—Kenyon & Kenyon LLP

(57) ABSTRACT

A manufacturing method for a micromechanical semiconductor element includes providing on a semiconductor substrate a patterned stabilizing element having at least one opening. The opening is arranged such that it allows access to a first region in the semiconductor substrate, the first region having a first doping. Furthermore, a selective removal of at least a portion of the semiconductor material having the first doping out of the first region of the semiconductor substrate is provided. In addition, a membrane is produced above the first region using a first epitaxy layer applied on the stabilizing element. In a further method step, at least a portion of the first region is used to produce a cavity underneath the stabilizing element. In this manner, the present invention provides for the production of the patterned stabilizing element by means of a second epitaxy layer, which is applied on the semiconductor substrate.

15 Claims, 15 Drawing Sheets

Fig. 13e              Fig. 13f

METHOD FOR MANUFACTURING A MEMBRANE SENSOR

FIELD OF THE INVENTION

The present invention relates to a method for manufacturing a semiconductor component.

BACKGROUND INFORMATION

Semiconductor elements, and membrane sensors, in particular, as well as methods for producing membrane sensors on the base of semiconductor substrates such as silicon wafers are already known. For instance, flat porous membrane regions are arranged on the semiconductor substrate as substrate for sensor structures, and a cavity is produced underneath the membrane, e.g., for the thermal insulation of the membrane.

The membrane sensors currently on the market are mostly fashioned as thin film membrane sensors. For this purpose, layer systems in thicknesses of between several 10 nm and several μm are deposited on a carrier substrate, and the carrier substrate is subsequently removed in predefined areas in order to obtain self-supporting membrane areas. The structural elements of the sensor can then be arranged in the center of the membrane.

Surface micromechanics (SMM), in which a sacrificial layer is generally used that is deposited on the front side of a carrier substrate before membrane deposition, is another possibility for exposing the membrane. The sacrificial layer is later removed from the front side of the sensor through "detachment openings" in the membrane, whereby a self-supporting structure is created. These surface micromechanical methods are comparatively costly, on account of the necessity for separate sacrificial layers.

Published German patent document DE 100 32 579 discloses a method for manufacturing a semiconductor element and also a semiconductor element produced according to the method, in which, e.g., for a membrane sensor, a layer of semiconductor carrier material that was rendered porous is arranged above a cavity. Two layers having different porosities are formed to produce the cavity using appropriate etching parameters. Whereas the first layer has lower porosity and seals up during a subsequent first annealing step, the porosity of the second layer increases during the annealing step in such a way that a cavity is formed. In a second process step, at a higher annealing temperature, a relatively thick epitaxy layer as second membrane layer is grown on top of the first membrane layer formed from the first porous layer.

It may also be provided that a thin epitaxy layer be grown during the first annealing step in order to ensure complete sealing of the porous first layer, which is used as starting layer for the epitaxy growth of the thick epitaxy layer. In this context, a lower growth rate is selected at a lower temperature compared to the subsequent deposition of the thick epitaxy layer.

As a result of the mentioned measures, the construction of an SMM semiconductor element can be simplified considerably since no additionally deposited sacrificial layer is required and, furthermore, the membrane itself or an essential portion of the membrane is produced from semiconductor substrate material.

However, tests have shown that at least partially porous membrane may get damaged during manufacture, or that damage may not always be reliably prevented under normal operating conditions. To avoid damage to the membrane during manufacture or in regularly occurring application cases, published German patent document DE 101 38 759 provides a method for manufacturing a semiconductor element having a semiconductor substrate, in which the semiconductor substrate receives a different doping in the region of the porous membrane layer than the doping of the region of the subsequent cavity. After doping, the semiconductor material of the membrane layer is rendered porous, and the semiconductor material underneath the semiconductor material, rendered porous, is at least partially removed or relocated to provide a cavity.

Published German patent document DE 100 30 352 discloses a micromechanical component which has a support body made from silicon and a regionally self-supporting membrane which is joined to the support body. The membrane is regionally and superficially provided with at least one stabilizing element for support. To form the regionally self-supporting membrane, the silicon is rendered porous in a first region and is selectively removed via an etch opening once the membrane layer has been deposited.

SUMMARY OF THE INVENTION

The present invention provides a manufacturing method for a micromechanical semiconductor element as well as a semiconductor component fabricated by this method. To produce the semiconductor element, it is provided that a patterned stabilizing element having at least one opening be produced on a semiconductor substrate. The opening is arranged such that it allows access to a first region in the semiconductor substrate, this first region having a first doping.

Furthermore, at least a portion of the semiconductor material having the first doping is to be dissolved out of the first region of the semiconductor substrate. In addition, using a first epitaxy layer deposited on the stabilizing element, a membrane is produced above the first region. In a further method step, at least a portion of the first region is used to produce a cavity underneath the stabilizing element. The present invention thus provides the patterned stabilizing element by means of a second epitaxy layer, which is deposited on the semiconductor substrate.

By growing the first epitaxy layer on the stabilizing element, the produced membrane advantageously has greater stability since, first of all, the stabilizing element supports the first epitaxy layer and, secondly, a uniform growing of the first epitaxy layer on the stabilizing element is possible without crystal faults.

In accordance with the present invention, it may be further provided that the epitaxy conditions be selected such that the first epitaxy layer, starting from at least a portion of the stabilizing element, seals the at least one opening above the first region in a lateral and/or vertical direction. The epitaxy conditions are advantageously chosen such that the epitaxial growth occurs only on the stabilizing element and not on the first region. One way of achieving this is by separate passivation of the first region. Within the framework of this epitaxy process, it may be provided that the stabilizing element be largely covered.

The cavity of the semiconductor element may be produced in an additional method step by a thermally induced relocation process of the semiconductor material of the first region. It may be provided, in particular, that this relocation be implemented after the epitaxial growth of the first epitaxy layer and thus after production of the membrane.

In an example embodiment of the present invention, the stabilizing element is built from the second epitaxy layer. In doing so, the second epitaxy layer is provided with openings in such a way that the doped semiconductor material of the first region is able to be removed through these openings. One possibility for producing these openings is to expose the second epitaxy layer at least regionally to a light source and remove the areas of the second epitaxy layer exposed to light in this manner. In this context, it may be provided that the removal of the light-exposed material of the second epitaxy layer and the selective removal of the semiconductor material provided with the first doping from the first region be implemented in the same method step.

However, it may also be provided that the illuminated areas on the semiconductor substrate or on the second epitaxy layer are precisely not attacked during an etching process. As a result, the illuminated regions would remain standing in the form of webs, for instance above a first region rendered porous by etching.

The second epitaxy layer deposited on the surface of the semiconductor substrate may be patterned locally, for instance via an additionally applied passivation layer. It may be provided here that the second epitaxy layer patterned in this manner form a cohesive second region above the first region. This second region may be embodied in the form of a lattice, for instance, and/or in the form of interconnected webs.

In an example embodiment of the present invention, an SiC layer is epitaxially deposited on the semiconductor substrate and subsequently patterned. If this patterned SiC layer is not processed further, the first epitaxy layer is able to grow on the SiC layer in polycrystalline form in a further epitaxy step. In contrast, in a thermal treatment of the patterned SiC layer, it is possible for the second epitaxy layer to grow in a monocrystalline manner.

The stabilizing element advantageously has at least one web and/or lattice above the cavity. As an option, the stabilizing element may also have an edging at the rim of the cavity. When the stabilizing element is embodied above the cavity, it may be provided that the thickness of the stabilizing element vary. Furthermore, it is possible that the edging has a greater thickness compared to the lattice and/or the at least one web.

The manufacturing method according to the present invention provides the particular advantage that the rigidity of the membrane may be adjusted via the positioning of the openings on the stabilizing element, and/or that the webs may be designed by varying different manufacturing parameters. The parameters during the epitaxial growth, the geometric arrangement of the openings and/or the lateral or vertical extensions of the webs may be considered manufacturing parameters. For instance, webs having a triangular cross section or having different vertical and/or lateral extensions are able to be produced.

The lattice or the at least one web in the surface area of the semiconductor substrate may be created by combining at least two implantation steps. In the process, a second doping that is differentiable from the first doping of the first region may be produced in a second region of the semiconductor substrate. In a subsequent method step, this second region may then be further developed into the stabilizing element or into the lattice and/or a web. This may be done, for instance, in that only the semiconductor material is removed from of the first region during the following selective removal, but the material of the second region remains on or within the semiconductor substrate.

In an example embodiment of the present invention, a third region, which likewise has the first doping, is produced above the first region, having the first doping, in the semiconductor substrate. The doping of the third region has a higher doping concentration than the doping of the first region. Furthermore, it is provided that, above the first and the third regions, the second epitaxy layer be produced with a second doping that is differentiable from the first doping. By patterning the second epitaxy layer, it is possible to gain access to the third and finally to the first region through the epitaxy layer in a further method step. Afterwards an etching method is utilized to remove the semiconductor material, which method selectively dissolves out only the semiconductor material having the first doping, but will not attack the material having the second doping. By choosing the higher doping concentration in conjunction with an appropriate etching method, more semiconductor material is able to be dissolved out of the third region than is dissolved out of the first region. Such a method makes it possible to produce a virtually planar underside in the stabilizing element formed in this manner.

In another example embodiment of the present invention, the surface of the semiconductor substrate is patterned across at least a portion of the first region having the first doping. Afterwards, a second epitaxy layer having a second doping is produced on the surface of the patterned semiconductor substrate and likewise patterned. It is provided in this context that the patterned second epitaxy layer form the stabilizing element.

The semiconductor material is then selectively removed from the first region, and the first epitaxy layer is deposited on the first and second regions patterned in this manner.

It is advantageously provided that the first and the second doping regions have different dopings. For instance, the first region may have a p– doping, and the second region, the edging or the lattice and/or the at least one web may have an n– doping.

An example embodiment of the present invention may provide that both the first epitaxy layer and the stabilizing element or the lattice or the at least one web have a monocrystalline form. However, it may additionally be provided that the first epitaxy layer and the stabilizing element have a polycrystalline design.

BRIEF DESCRIPTION OF THE DRAWINGS

FIGS. 13a-13g show various example embodiments of a method for producing a lattice having a desired cross-section profile.

DETAILED DESCRIPTION

Figure 1A:
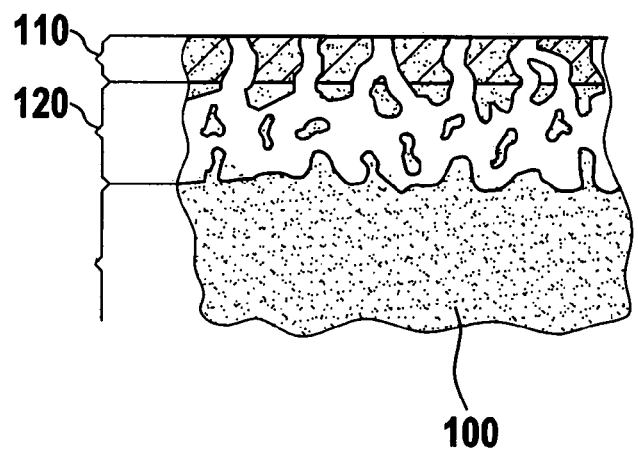
FIGS. 1a-1d illustrate various stages of a conventional method for manufacturing a micromechanical membrane.
Figure 1B:
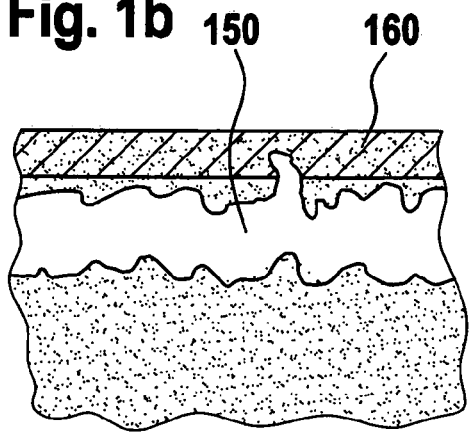
Figure 1C:
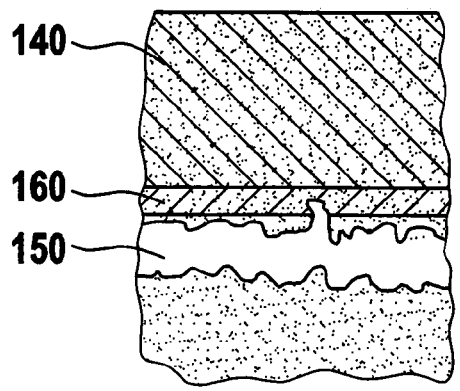

As shown in FIG. 1a, a conventional method for producing a membrane provides using a porous double layer in a semiconductor substrate 100, i.e., using a low-porosity layer 110 and a high-porosity layer 120 situated underneath it, it is possible to produce a starting layer 160 that is suitable for the growth of epitaxy layer 140, as well as a cavity 150 (cf. FIG. 1b). The transformation is accomplished by a first annealing step (at approximately 900 to 1000° C.), during which the semiconductor atoms of low-porosity layer 110 relocate in such a way that the surface seals. In the same or in a following annealing step, cavity 150 is then able to be formed as well by relocation of the semiconductor atoms out of high-porosity layer 120. This is accomplished in that the pores enlarge under the influence of the annealing step and finally unite to form a "giant pore," which then constitutes the cavity. An epitaxy layer 140 may then be deposited on starting layer 160 to produce the membrane, the epitaxy layer determining the characteristics of the membrane. However, there will be some pores that do not close in the production of such a membrane since the available silicon is insufficient. In some areas several small pores also unite to form a large pore so that pores having diameters of up to 0.5 μm are created. Since the crystal structure of the base is faulty, the epitaxy layer, which forms the later membrane, is unable to grow on these unsealed areas in the starting layer in a monocrystalline manner. As a result, crystal faults form in the epitaxy layer (for instance due to stacking faults). In the further course of the process, piezoresistive resistors, for instance, which are required for the functioning of a pressure sensor, are produced on the upper surface of the membrane. Crystal faults in the epitaxy layer may degrade these resistors over the service life of the sensor and result in drift of the sensor signal.

When producing a monocrystalline epitaxy layer, the deposition of a first thin epitaxy layer (thinner than 1 μm, preferably 200 to 600 μm), during which additional semiconductor material is offered for the complete sealing of the starting layer immediately at the outset, during or at the end of the first annealing process, may remedy this situation. It may be the same semiconductor material which is already present in layer 110 and/or is used in epitaxy layer 140 that is deposited. If semiconductor substrate 100 is made of silicon, for instance, such a method gives the offered silicon atoms sufficient time to arrange themselves according to the silicon crystal of the base. A lower temperature and a reduced growth speed compared to the subsequent, thick epitaxy layer are advantageously selected during the growing of the thin epitaxy layer. As an example, the temperature during the deposition of the thin epitaxy layer is approximately 900 to 1000° C., whereas the growth speed is selected to be less than 0.5 μm/min.

After the growth of this thin epitaxy layer and a possible continuation of the annealing process, the substrate is exposed to a higher temperature (preferably 1100 to 1200° C.) so that a second, thick epitaxy layer 140 may then be grown there (a few μm). Prior to the growing of the second epitaxy layer, further annealing at the higher temperature may also be carried out in order to heal any possible crystal faults in the sealed starting layer. Because of its relatively great thickness—compared to the starting layer and the first epitaxy layer—the second epitaxy layer forms the actual membrane. This membrane may then be used for a pressure sensor, for instance or, following further patterning, for an acceleration sensor as well.

Figure 1D:
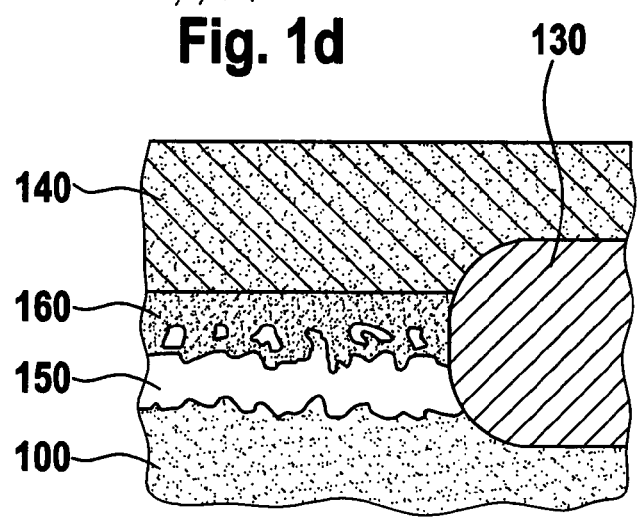

Depositing a single-crystalline, micromechanical membrane on a porous starting layer has various weak points, which may have a negative effect on the production or the service life of the membrane. For example, cracks may form in the porous starting layer, such cracks spreading to the epitaxy layer deposited thereon. Furthermore, transitions may occur from the, for instance, p+ doped starting layer 160 to an edging of the starting layer. In an overlap of both dopings, the p+ doping is reduced to a p– doping (see 130, FIG. 1d). However, a lower p– doping also causes higher porosity. This effect is also utilized in the production of the double layer according to FIG. 1a where low-porosity layer 110 has a p+ doping, for instance, and high-porosity layer 120 has a lower p– doping. Therefore, the low-porosity layer is joined to the edge via a high-porosity, and therefore fragile, region. Cracks, among others, may form here during the production.

Figure 2A:
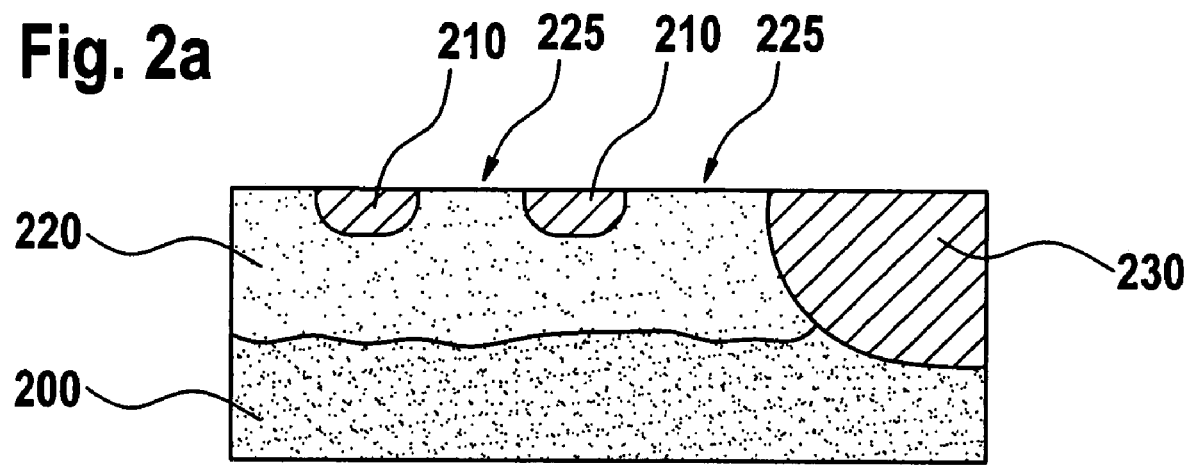
FIGS. 2a-2b illustrate the various stages of an exemplary embodiment of the method of the present invention.

To produce a monocrystalline membrane according to the present invention, a first region 220 and a first portion of a second region 210 having different dopings are produced on a semiconductor substrate 200, as shown in FIG. 2a. First region 220 may also have the substrate doping. In the following exemplary embodiment, it is to be assumed that semiconductor substrate 200 has a p– doping, first region 220 a p– or p+ doping, and first and second portions 210 and 230 of the second region have an n– or n+ doping. In an exemplary embodiment, the first portion of the second region denoted by reference numeral 210 in FIG. 2a is formed on the surface of the semiconductor substrate as a type of web or lattice, whereas the second portion of the second region denoted by reference numeral 230 in FIG. 2a is formed as framing of first region 220. In another example embodiment of the present invention, it may be provided that portion 230 and portion 210 of the first region have different dopings, such as $n^+$ or n.

Using a suitable etching process, for instance anodizing or electropolishing, first region 220 is etched to be rendered porous. As already described, first region 220 may be both a portion of untreated semiconductor substrate 200 and an additionally doped region. The latter has the advantage of allowing a sharper delimitation in the production of porous region 220. Whereas first region 220 is etched to be rendered porous up to a depth of 5 to 20 μm, for instance, starting from the surface of semiconductor substrate 200, second region 210 essentially will not be changed by the etching process. In an appropriate selection of the lateral extension of second region 210 on the surface of semiconductor substrate 200, first region 220 may be rendered porous by etching underneath second region 210 as well. For the further processing, an exemplary embodiment provides that first region 220 have high porosity, e.g., having pore sizes of 1 nm up to several μm in diameter. As an alternative, high porosity may be achieved by producing very many small pores (~5 nm) or a few very large pores (e.g., up to several 100 nm). As in the production of large pores, a lot of silicon is etched out as a result. If semiconductor substrate 200 is made of silicon, a (natural) oxide layer can be found on the surface of the untreated semiconductor substrate. For this reason, a reduction of the (natural) oxide layer on the silicon surface is obtained in a following process step by short annealing of the semiconductor substrate or the silicon substrate being carried out under a hydrogen atmosphere. As an alternative, an "HF load" method or an HF GPE (gas phase etching) method with subsequent low-temperature epitaxy may be used to achieve the same effect.

Figure 2B:
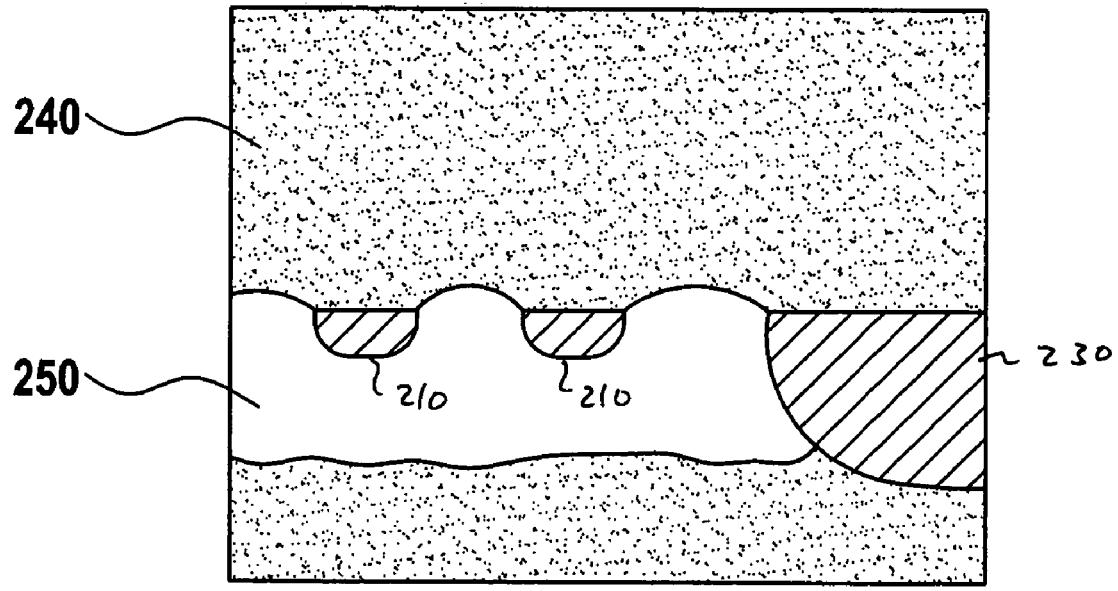

Afterwards the semiconductor substrate is heated to growth temperature (1000 to 1200° C.) before the deposition of a monocrystalline epitaxy layer 240 is initiated. The epitaxy layer grows predominantly on second regions 210 and 230. In an exemplary embodiment, regions 210 are formed as monocrystalline webs to promote the growth of the epitaxy material. The growth not only occurs vertically, i.e., perpendicular to the surface, but laterally as well, so that the regions between individual webs 210 are sealed by a monocrystalline layer. FIG. 2*b* shows the membrane after epitaxy layer 240 has been grown. During the growth process and under the influence of the growth temperature or during an additional annealing operation, the highly porous silicon has relocated to form a large cavity 250. The form resulting from the overgrowth of the free regions between the webs can be seen on the underside of the membrane in FIG. 2*b*. Further annealing allows this form to fuse in a planar manner.

The highly porous silicon between monocrystalline webs 210 is advantageous here since it prevents the growth of silicon inside the cavity region. If the cavity were completely free, depending on the growth conditions, silicon would be able to grow on the cavity walls from the beginning of the epitaxy growth. However, due to the initially porous surface between webs 210, which relocates over course of the epitaxy process, it is prevented that silicon grows between webs 210 or that a significant portion of the epitaxy material enters cavity 250.

Of course, the production of an epitaxy layer having a cavity situated underneath it by means of a "pororization" as it is described in the present invention may also be carried out when other materials or semiconductor materials are used and is not restricted to the use of silicon. However, this requires that these other materials or semiconductor materials are also able to be rendered porous.

In another exemplary embodiment of the present invention, the region between and underneath the webs is not etched to be rendered porous, but is completely dissolved out. This may be accomplished by electropolishing, for instance, and the porosity is increased by varying the etching parameters (such as increasing the current, reducing the HF concentration), to such a degree that it reaches 100 percent. As described earlier, the webs are now able to grow together, which entails the danger of silicon growing inside the cavity as well. To avoid this, the inside of the cavity may be protected by a layer that prevents silicon from growing there.

Figure 3A:
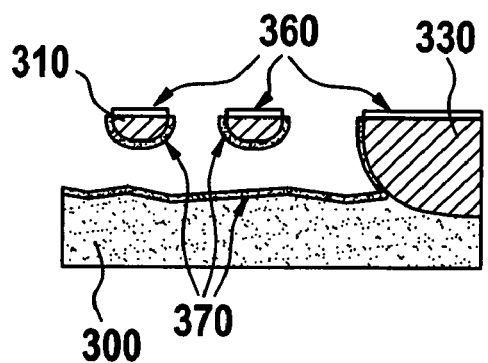
FIGS. 3a-3b illustrate the steps of a treatment of the surface to prevent the deposition of epitaxy material according to the present invention.
Figure 3B:
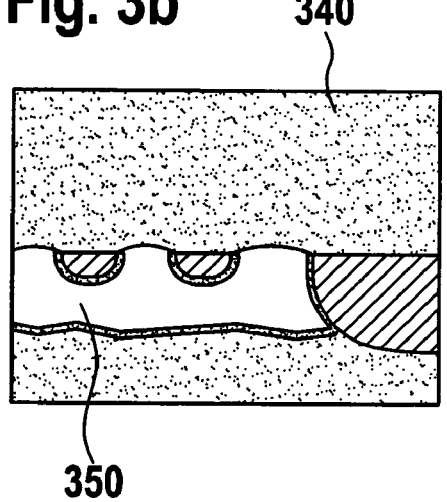

Such a protection is able to be achieved, for instance, by the application of a silicon nitride layer (SiN) 360 on the surface of second regions 310, as shown in FIG. 3*a*. Using electropolishing, second regions 310, which are embodied in the form of webs and connected to each other and to framing 330, may subsequently be exposed by removal of the first region (cf. cross section through the semiconductor substrate in FIG. 3*a*). An oxide 370 is produced on the exposed regions of future cavity 350 via thermal oxidation, for instance. Using hot phosphoric acid, for example, nitride 360 is subsequently able to be selectively detached with respect to oxide 370. Such preparation allows a selective epitaxy to be achieved, i.e., the epitaxy material 340 (such as silicon) will grow only on the regions that are not protected by oxide 370, thereby preventing silicon growth inside cavity 350.

Another possibility for selectively preventing the growth of silicon is to apply a thin (<60 nm) silicon oxide layer (SiO) on those regions that are not to be electropolished prior to the application of silicon nitride layer (SiN) 360. After webs 310 have been exposed through a suitable etching process, for instance by electropolishing, an oxide may be produced on the exposed regions via thermal oxidation, as in the already discussed example. However, it must be taken into account that this oxide has to be thicker than the oxide underneath the SiN overlay-mask. The nitride may later be selectively removed with respect to the oxide. As an alternative, a dry-etching process in which the oxide and the nitride have the same etching rates may be carried out as well. By suitable selection of the etching time it may be ensured that a sufficiently thick oxide layer remains on the cavity walls once the oxide that was situated underneath the SiN has been dissolved. A selective epitaxy may then be carried out analogously to the above exemplary embodiment.

In another exemplary embodiment in which the semiconductor substrate is made of silicon, for instance, the silicon is rendered porous by etching between and underneath the webs. Afterwards a thin layer of oxide, which is a few nm thick, for example, will be produced on all silicon surfaces (i.e., wafer surface as well as on the surface of the pore walls).

This may be accomplished by thermal oxidation, for instance, or by oxygen-plasma treatment, by chemical oxidation or some other type of treatment as well. This oxide prevents the relocation of the porous silicon during additional high-temperature steps as they are required in epitaxy or other kiln processes. The oxide on the wafer surface may then be removed by means of a brief HF dip using diluted hydrofluoric acid (HF). Due to the surface tension the hydrofluoric acid does not penetrate the pores so that the oxide layer on the pore walls remains as before. A corresponding description of such a pretreatment for stabilizing the porous silicon for a subsequent epitaxy growth can be found, for instance, in the article "Low-pressure vapor-phase epitaxy of silicon on porous silicon," *Material Letters* 94 (1988), by L. Vescan et al. An epitaxy layer may subsequently be grown, this layer growing predominantly on the monocrystalline webs. The surface is sealed by lateral growth. After the epitaxy an access hole may be etched through the epitaxy layer from the front side, for instance, or also from the back side of the semiconductor substrate, and the oxidized porous silicon be selectively dissolved out through the access hole. As an option, the access hole may also be sealed again after the removal process, but it must be taken into account that the pressure prevailing during sealing of the access hole defines the reference pressure in the cavity.

The membrane produced in this manner may be used, for instance, for a pressure sensor having piezoresistive resistors. For this purpose a circuit may be integrated adjacent to or on top of the membrane. If an access hole for the selective removal of the semiconductor material in the second region was produced on the backside, a backside sensor or differential-pressure sensor is obtained, which has a precisely defined membrane thickness compared to the related art. If an access hole is made from the front, this hole must be sealed again in a pressure-tight manner for the pressure-sensor application.

In another exemplary embodiment, if the surface is too rough after the holes have become overgrown, a step for smoothing the surface may generally be performed as an option. One possible method for achieving the smoothing is chemical-mechanical polishing (CMP).

In another exemplary embodiment the membrane is patterned in the form of resonator structures. The use of such structures makes is possible to realize acceleration sensors and/or yaw-rate sensors, for instance.

Figure 4A:
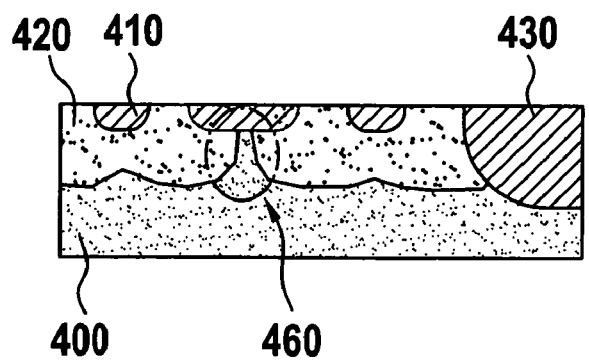
FIGS. 4a-4b illustrate the steps of an additional exemplary embodiment for the manufacture of a membrane according to the present invention.
Figure 4B:
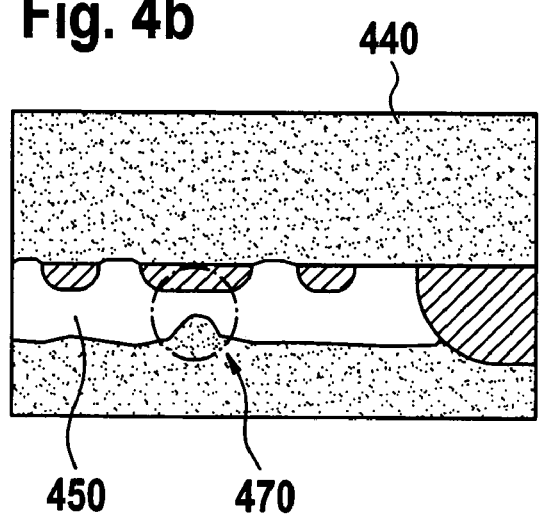

One possibility for stabilizing the webs before the epitaxy layer is grown is to optionally produce supports underneath the webs, which melt away during subsequent high-temperature steps (epitaxy or annealing steps (oxidation diffusion) for the production of integrated circuits) due to relocation of the silicon atoms. As can be seen from FIG. 4a, in region 460, columns are produced if webs 410 are wider than half of the etching depth in first region 420. The isotropic undercut-type etching during anodization is then insufficient to anodize the silicon underneath the broadened webs 410 or to dissolve it out. For energy-related reasons (minimizing the surface energy) silicon relocates at high temperatures (>1000° C.). In the process the column (region 470) "melts" and the firm connection between substrate and membrane is interrupted. As a result, the membrane is able to move freely, as shown in FIG. 4b.

Instead of individual webs, the second region above the cavity may also be arranged in the form of a lattice, porous regions 510 and webs 500 alternating with each other. In FIGS. 5a to 5f, various possible example embodiments are shown. However, the mentioned examples should not be considered as final, limiting illustrations. In this context, better resist adhesion is noticeable in FIGS. 5e and 5f, for example.

Figure 6A:
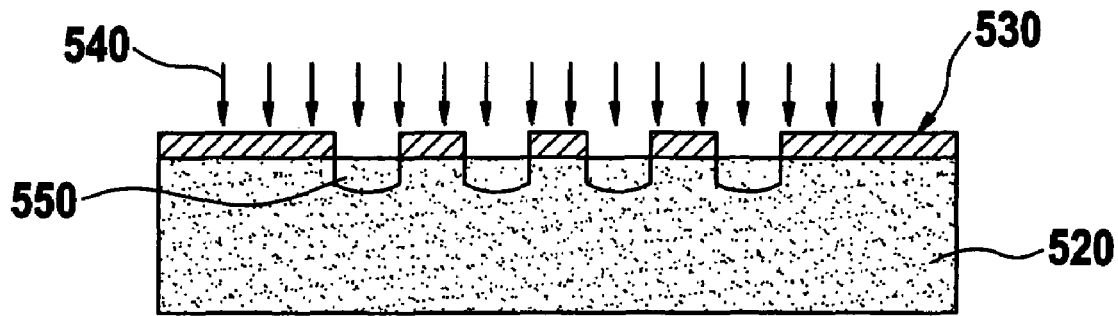
FIGS. 6a-6c show the steps of an example embodiment of a method for producing webs or lattices above a cavity.
Figure 6B:
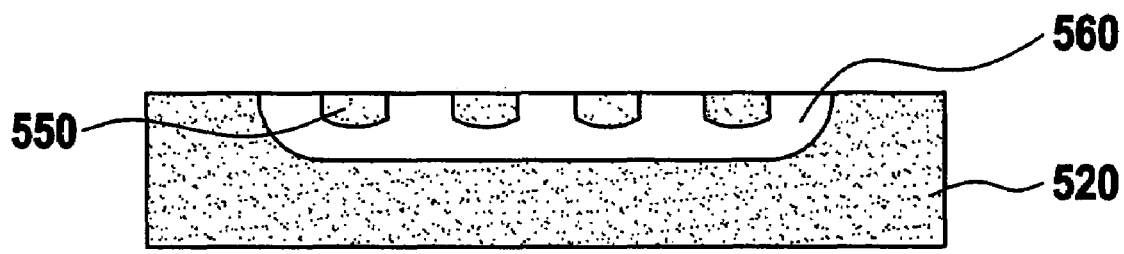

Various methods are available to realize the webs or the lattice on which the monocrystalline membrane is deposited in a later method step. For instance, in one exemplary embodiment the webs or the lattice are/is not produced by local n–doping, but by local amorphization of the single-crystalline Si substrate. As shown in FIG. 6a, the single-crystalline semiconductor substrate made of silicon 520 is bombarded with high-energy ions 540 such as argon ions. Due to this bombardment and the use of an implantation mask 530, for instance made of $SiO_2$, the single-crystalline structure is destroyed and regions 550 of amorphous silicon are created. The amorphous Si 550 remaining behind will not be attacked in the following anodization in hydrofluoric acid, so that underneath amorphous regions 550 a region 560 of porous Si is produced (FIG. 6b), which is able to relocate to form a cavity in a subsequent annealing process. In this way an amorphous Si lattice 550 is produced, which may be overgrown by an epitaxy process prior to or after this subsequent annealing operation.

Figure 6C:
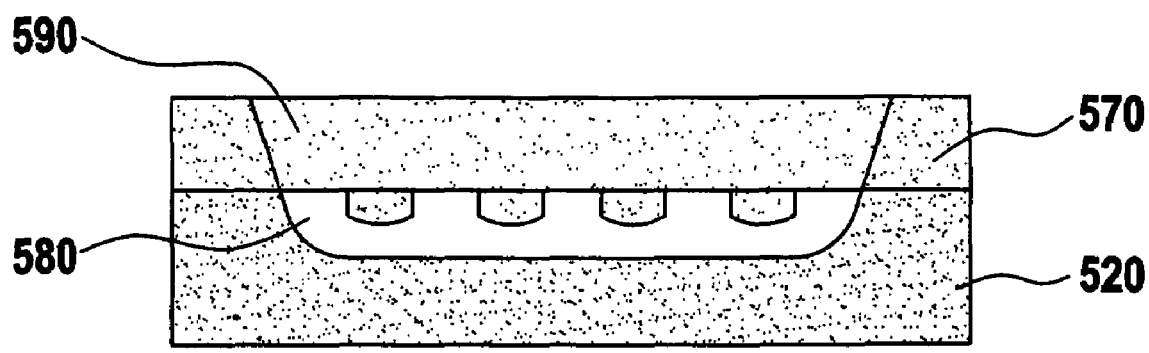

In accordance with the amorphous basis, epitaxial layer 590 (FIG. 6c) does not become single-crystalline, but polycrystalline, in contrast to layer 570 growing on top of monocrystalline region 520. The transition between polycrystalline region 590 and monocrystalline region 570 is determined by the epitaxy parameters.

In a variant of this exemplary embodiment, additional annealing may be carried out before the epitaxy layer is grown. Due to this annealing, the amorphous webs are able to recrystalize and relocate in the form of a single-crystalline lattice. This recrystallization step makes it possible to produce a monocrystalline Si epitaxy on the lattice webs.

Figure 7A:
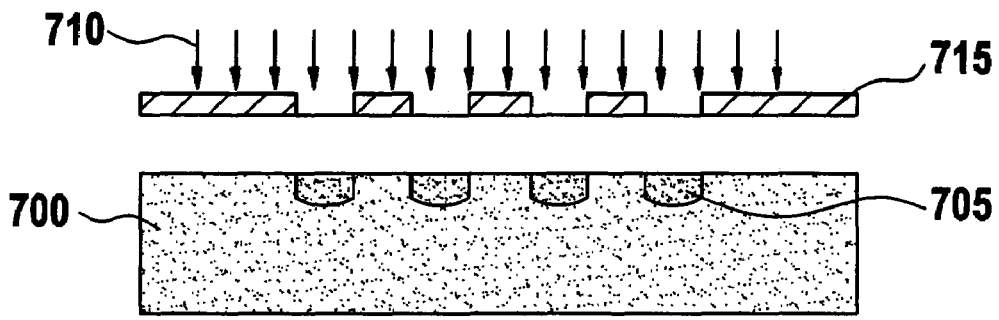
FIGS. 7a-7c show the steps of another example embodiment of a method for producing webs or lattices.
Figure 7B:
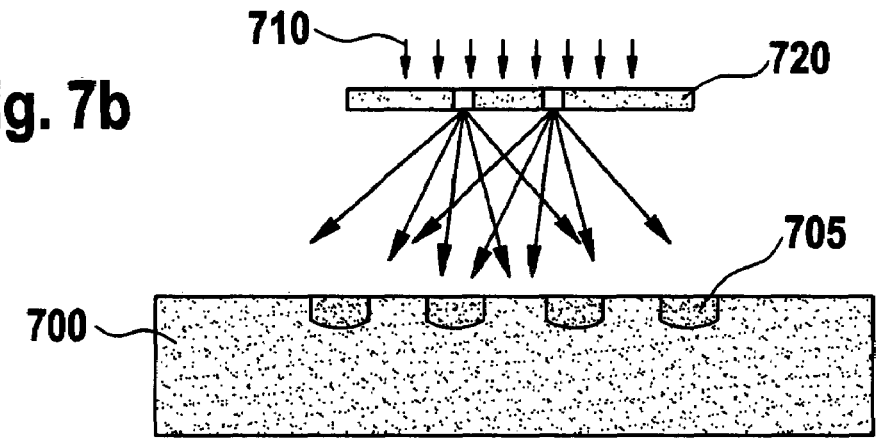
Figure 7C:
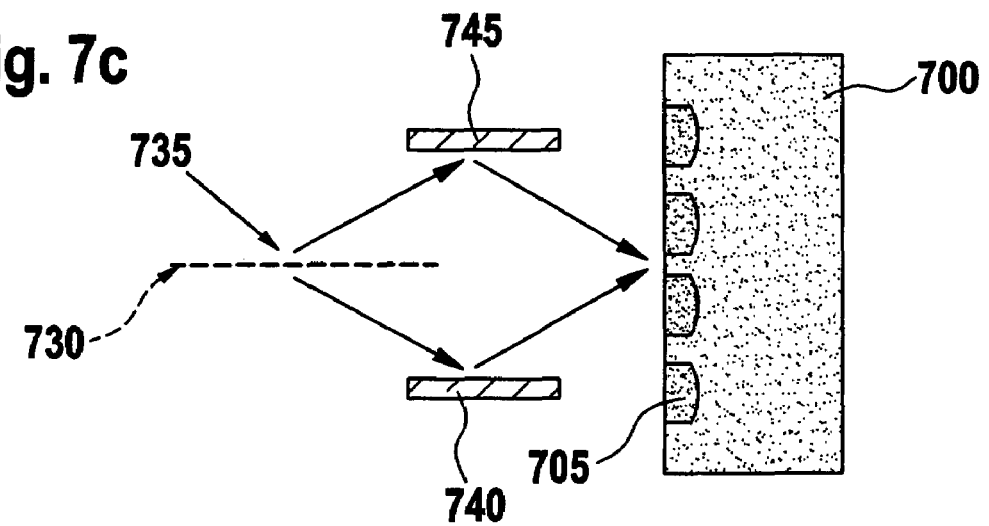

In another exemplary embodiment for producing an Si lattice on porous silicon, the illumination selectivity of the anodization process may be utilized. As illustrated in FIGS. 7a to 7c, a p– doped silicon substrate 700 is illuminated during anodizing (using ions 710 or laser beam 735), so that regions 705 are produced, which counteract the anodizing process due to the charge carriers produced by the internal photo effect. With the aid of a suitable shadow mask 715, a diffraction pattern 720 or a holographic lattice (FIG. 7c), a lattice-shaped region 705 of substrate 700 to be anodized may be illuminated and thereby protected from being rendered porous. Since the penetration depth of the light is limited as a function of the wavelength, the region protected in this manner is ultimately etched in an undercut manner. The following epitaxy process or the production of the cavity may then be implemented in a manner that is analogous to the method already described.

To produce a holographic lattice, a laser beam 735 as shown in FIG. 7c may be guided onto a beam splitter 730, the two partial beams being reflected at mirrors 740 and 745 and interacting with one another on the substrate surface in region 705.

Figure 8A:
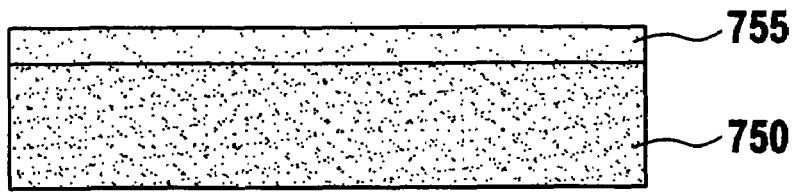
FIGS. 8a-8b show the steps of another example embodiment of a method for producing webs or lattices.
Figure 8B:
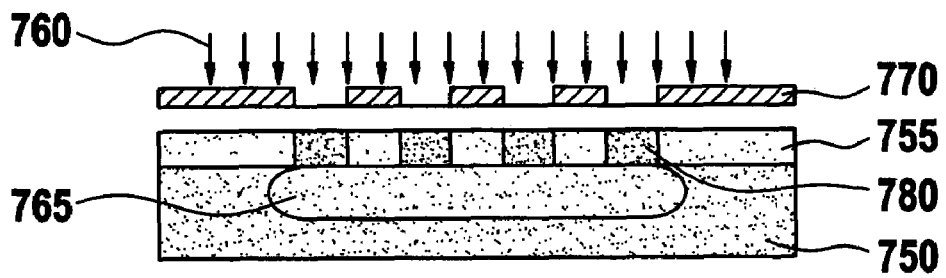

In an extension of the last exemplary embodiment, it may also be provided to first produce an n– doped Si epitaxy layer 755 on a p– doped Si substrate 750, as it is shown in FIG. 8a. According to FIG. 8b and similar to the previous exemplary embodiment according to FIGS. 7a to 7c, n– doped Si epitaxy layer 755 is illuminated by means of suitable lighting 760 and a shadow mask 770 (made from metal, for instance). The epitaxially produced n– Si is etched non-porous without illumination since no defect electrons are present. The local illumination produced by means of mask 770 generates the required charge carriers in the n– doped region, so that the n–doped epitaxy layer is able to be rendered locally porous by etching in these areas 780. If the etching procedure reaches the p– doted substrate 750 situated underneath, undercut-type etching is performed across the entire surface. Such undercut-type etching makes it possible to render substrate 750 porous by etching in region 765 since no illumination is required in the p– doped region. In addition to a shadow mask 770, diffraction patterns and/or holographic lattices as shown in FIGS. 7b and 7c may be used as well to produce local illumination on the surface of epitaxy layer 755.

Figure 9A:
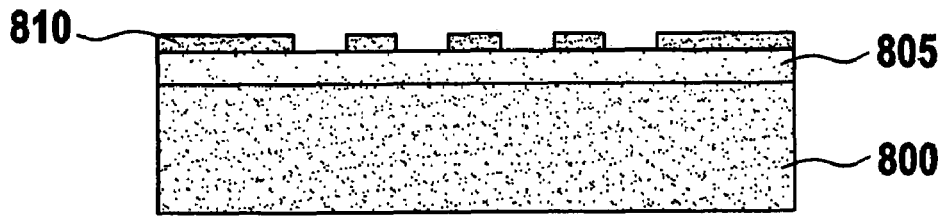
FIGS. 9a-9b show the steps of another example embodiment of a method for producing webs or lattices.
Figure 9B:
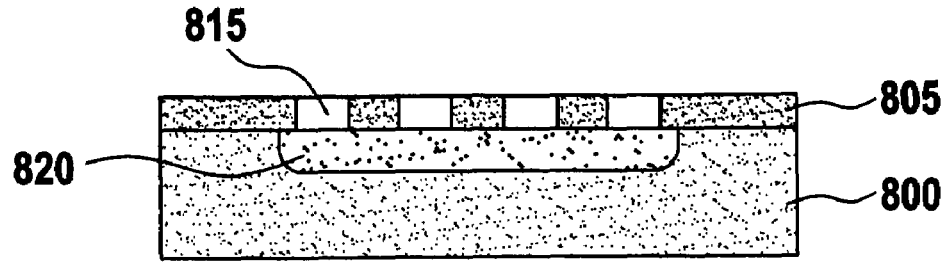

Another example for producing a lattice on porous silicon is the use of a patterned, n– doped Si epitaxy layer. To produce such a patterned n– doped Si epitaxy layer 805, an n– doped Si epitaxy layer 805 is deposited on a p– doped Si substrate 800 as shown in FIG. 9a, Si epitaxy layer 805 still being unpatterned at this stage. Subsequently, an oxide mask 810 is deposited, which may be patterned by HF, for instance. In a further process step, n– doped Si epitaxy layer 805 may then be patterned by means of trenches 815 via the trench mask produced in oxide 805. Since the trench process does not stop on p– Si substrate 800, trenches 815 must be produced in a time-controlled manner. However, slight over-etching into substrate 800 is non-critical. The structure thus obtained of oxide 810, n– doped epitaxy 805 and p– doped substrate 800 is then rendered porous by etching via anodization in HF, as shown in FIG. 9b. Oxide 810 and n– doped epitaxy layer 805 are not attacked in the process, whereas p– doped Si substrate 800 is rendered porous by etching. Prior to the subsequent epitaxial deposition of the membrane, oxide 810 will be removed so that the membrane is able to grow on the n– doped lattice webs.

Figure 10A:
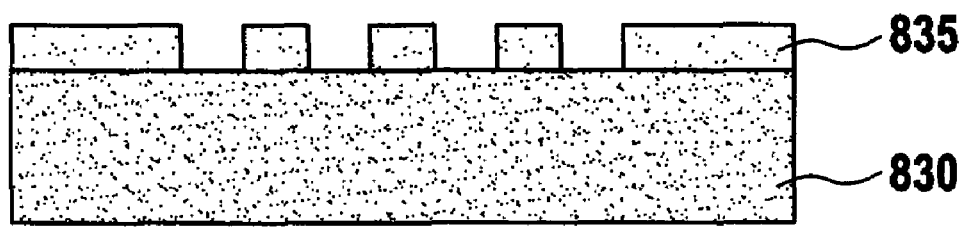
FIGS. 10a-10c show the steps of another example embodiment of a method for producing webs or lattices.
Figure 10B:
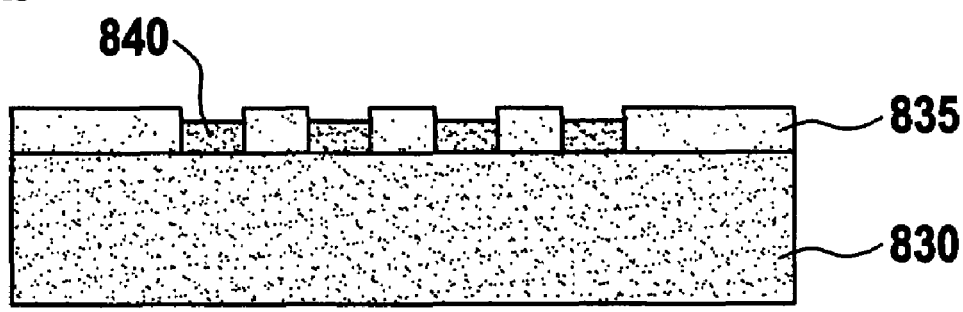
Figure 10C:
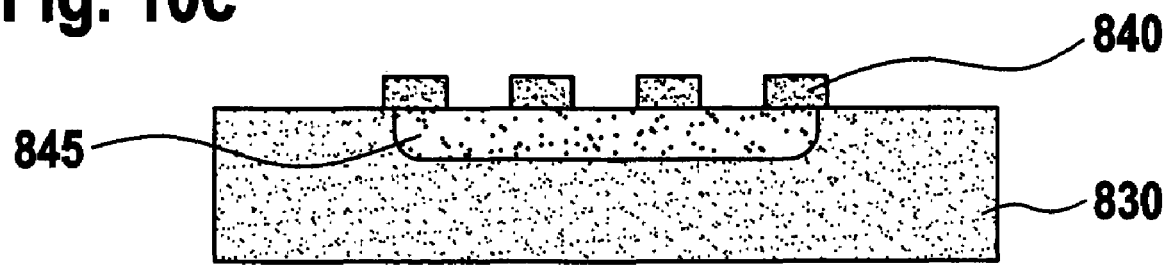

In a further exemplary embodiment, as shown in FIGS. 10a through 10c, a lattice may be produced on porous silicon 845 in that an n– doped Si epitaxy layer 840 is selectively grown on a patterned $SiO_2$ or $Si_3N_4$ mask 835. $SiO_2$ or $Si_3N_4$ mask 835 has such a passivizing effect that single-crystalline silicon 840 is able to grow only on exposed Si substrate 830, i.e., between oxide or nitride regions 835, as illustrated in FIG. 10b. As already described previously and shown in FIG. 10c, it is subsequently possible to produce a porous region 845 in substrate 830, which may be transformed into a cavity in a later annealing process.

An additional exemplary embodiment utilizes different porosities in the lattice and in the cavity region. Such an adaptation of the porosities in the mentioned regions allows the relocation of the porous silicon into a cavity or the growth of the epitaxial silicon membrane in a more optimal manner. For instance, it may be provided that a higher or lower porosity be produced in the cavity region than in the region of the holes. In addition to a sharp separation of the different porosity regions, a porosity gradient is also conceivable.

However, in the starting phase of the epitaxy for forming the membrane, attention must be paid that the cavity layer forms a sufficiently stable basis, so that an excessively high porosity in the cavity layer would be disadvantageous. Furthermore, it would be desirable to produce high porosity in the holes in the lattice region as well since this speeds up the formation of the holes at the beginning of the epitaxy growth. By appropriate selection of a (high) porosity in the lattice area, it may thus be prevented that the growth begins on the relocated silicon in the lattice holes. For if at least a portion of the epitaxial growth were to begin on the silicon between the lattice webs during the relocation, this might cause crystal faults, which would propagate in the membrane layer, for example as stack faults.

Figure 11A:
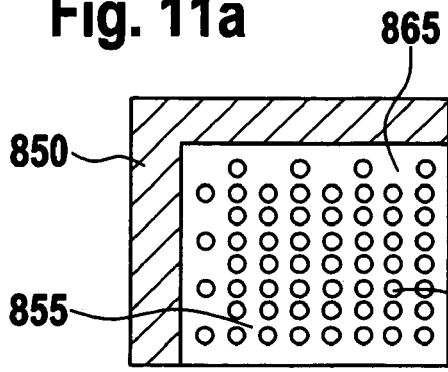
FIGS. 11a-11b and 12a-12c show example embodiments of various lattice and hole geometries according to the present invention.
Figure 11B:
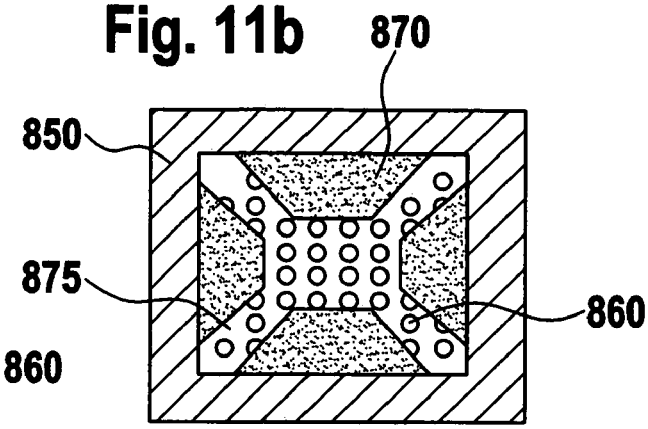

To optimize the mechanical properties of the epitaxial Si membrane, the lattice and hole geometries may be varied locally, as is shown in FIGS. 11a and 11b by way of example. Such a local variation may achieve an improved edge fixation of membrane 855 on substrate 850. It is conceivable in this case that lattice holes 860 are omitted in a regular pattern, for instance at the membrane edge, as it is illustrated in FIG. 11a. In this example, each second lattice hole at the outermost edge of the hole geometry is omitted, so that no lattice hole 860 may be found at location 865, for instance. In addition, however, it may also be provided that the outermost hole row have a smaller diameter than the more inwardly lying holes.

Another alternative is to broaden the lattice webs at the edge of the membrane. In addition, however, the (hole) lattice may also be arranged across only a portion of the membrane region, so that a self-supporting membrane is produced as shown in FIG. 11b. Substrate 850 encloses the etching area, which in turn is covered by regions 875 having lattice holes 860 and regions 870 without lattice holes 860. The membrane may then be epitaxially deposited on regions 870 and 875 patterned in this manner.

The mechanical properties of the membrane such as the resonant frequency and/or the rigidity may also be varied by correspondingly adapted geometries of the lattice webs and holes. One possibility for increasing the rigidity is to omit holes in the center of the membrane. However, reliable undercut-type etching of the holes must be ensured. This requirement results in a limit for the maximum number of holes that may be omitted.

If electrically active elements are applied on the membrane, it may also be useful to locally adapt the lattice and hole geometries. Piezoresistive resistors such as for a pressure sensor, for example, may be located in a region that stands out as a result of an especially defect-free epitaxy (avoidance of leakage currents and shunts via so-called diffusion pipes). This may be accomplished in that an especially low number of lattice holes, to be overgrown epitaxially, is present in these regions and/or that an especially adapted lattice and hole geometry is used, which becomes overgrown in a particular satisfactory manner.

Figure 12A:
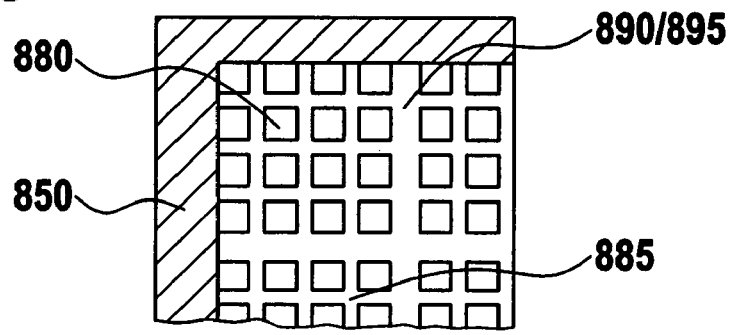

Of course, it is also possible to superpose a plurality of different lattice geometries and lattice profiles on top of one another and combine them in this manner. FIG. 12a, for instance, shows the simultaneous use of two different rectangular geometries. A second monocrystalline lattice 890 or 895 having broader or thicker webs is superposed on top of first monocrystalline lattice 885 having narrow webs and including porous regions 880. Such a combination may allow not only an additional local membrane reinforcement but also provides a stronger enclosure of the membrane in substrate 850.

Figure 12B:
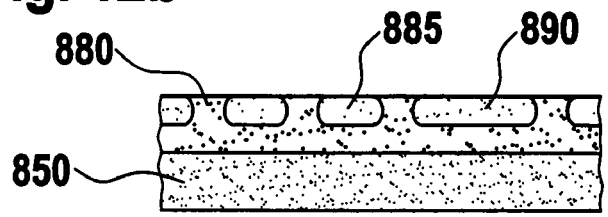
Figure 12C:
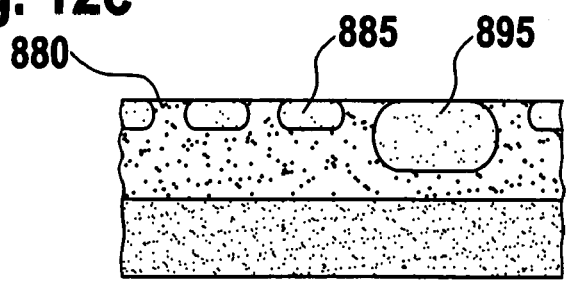

A schematic cross section through a membrane region having different lattice geometries is shown in FIG. 12b. It can be seen clearly that webs 885 and 890 have different lateral extensions. The superpositioning of different geometries in the form of a lattice may also be achieved by different implantations. Variations of the web profiles of the lattice are likewise possible here as is illustrated by the cross section shown in FIG. 12c. In this example two different webs 885 and 895 have been produced by different implantation energies and therefore different penetration depth.

Figure 13A:
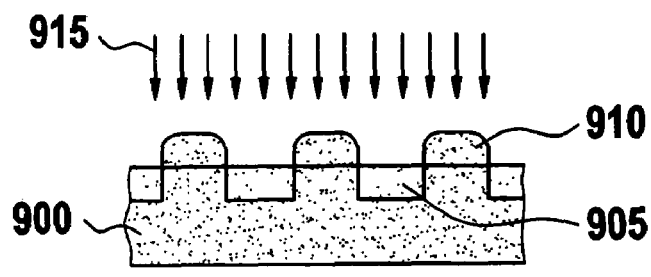
Figure 13B:
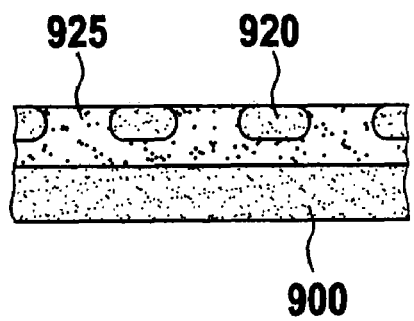

In addition to the arrangement of the holes in the membrane region, it is also possible, as already mentioned, to adapt the cross-section profiles of the lattice to the requirements of the membranes to be produced. In the least complicated case, as shown in FIGS. 13a and 13b, implantation areas 905 (e.g., n– doped regions in a p– doped substrate) are introduced in substrate 900 so as to form a lattice 920. Masks 910 of photoresist or Si oxide, which are irradiated by means of an implantation method 915, are used for the selective patterning of implantation regions 910. In this implantation operation, the energy or the particles used in implantation method 915 may be adapted to the substrate. After removal of mask 910, substrate 900 may be rendered porous around implantation areas 905, thereby creating webs 920 in porous region 925.

Figure 13C:
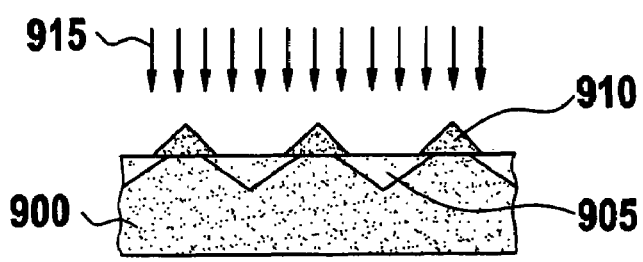
Figure 13D:
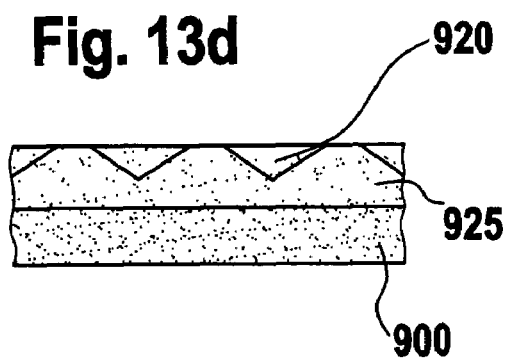
Figure 13D:
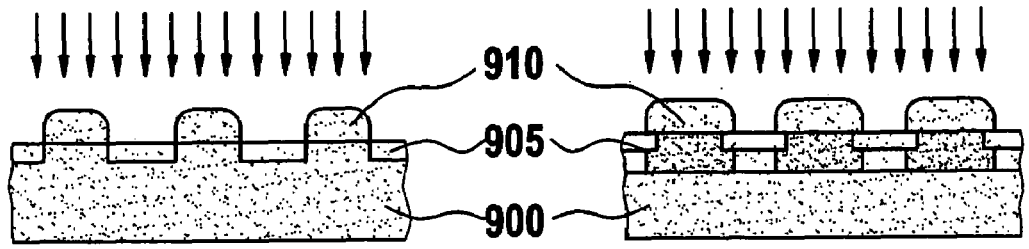

Suitable selection of the pattern of mask 910 (such as a gray-tone mask of photoresist or Si oxide) in conjunction with an appropriate implantation method 915 allows the lattice profile to be influenced in a variety of ways as is shown in FIGS. 13c and 13d. The triangular cross-section form of implantation regions 905 illustrated in these figures has advantages with respect to the relocation of porous silicon and the subsequent epitaxy. Here, the holes seal faster as a result of the smaller hole diameter on the substrate surface. Moreover, the region that must be overgrown by the epitaxy is smaller, which leads to fewer crystal faults in the epitaxy layer forming the membrane.

Figure 13G:

In addition to a simple implantation, a multiple implantation using different masks and/or implantation energies is conceivable as well. One possible result of a twofold implantation with an increase in the implantation energy in the second implantation step (FIG. 13f) is shown in FIGS. 13e through 13g. In FIG. 13g, a similar lattice profile results as that previously achieved in a masking of the substrate according to FIG. 13c.

In general, multiple implantations using appropriate masks and varying implantation energies are able to produce virtually unlimited lattice cross-section profiles.

Figure 14A:
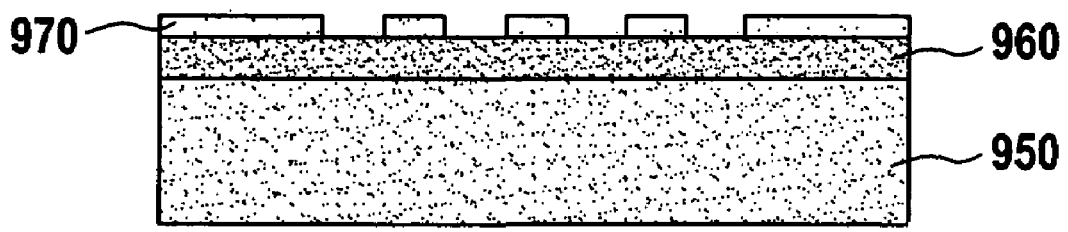
FIGS. 14a-14c show the steps of an example embodiment of a method for producing a lattice.
Figure 14B:
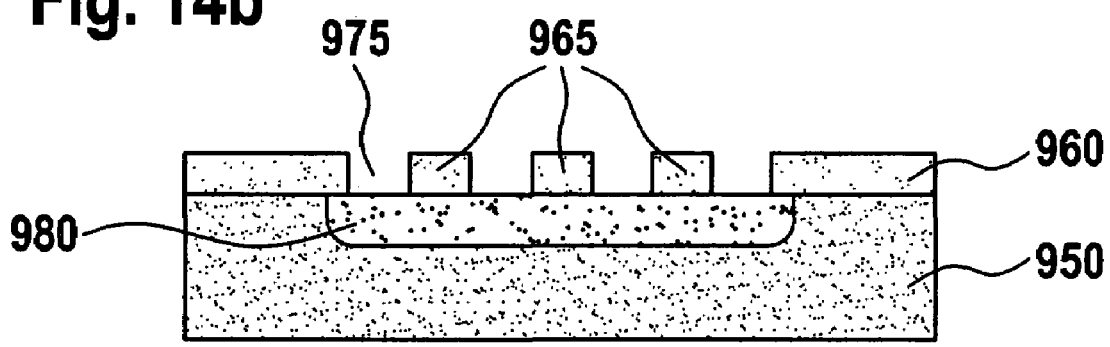
Figure 14C:
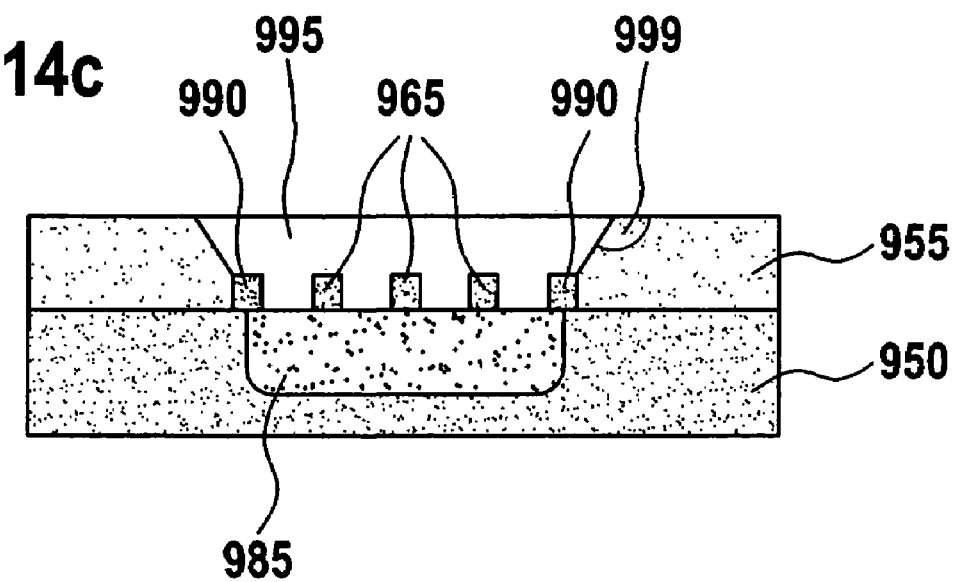

FIGS. 14a and 14b illustrate another possibility for producing a lattice on or within a region rendered porous by etching. In the process (shown in FIG. 14a), an SiC layer 960 is deposited via CVD (silane & propane) on a p– doped Si substrate 950 and patterned by means of an oxide mask 970, for instance in a wet process (in KOH, $KClO_3$ or similar) or a dry process (for instance $SF_6$). As shown in FIG. 14b, via holes 975 between lattice 965, which were created by the patterning of SiC layer 960, the p– doped silicon may be etched to be rendered porous by selective anodizing with respect to the SiC in region 980. The reason for this selective etching is that SiC with 2.4 eV (indirect) or 5.3 eV (direct) has a markedly greater band gap than Si. After lattice 965 has been produced, SiC layer 960 may be removed from the surface of the semiconductor substrate down to lattice 965 and a frame 990, which surround lattice 965. Silicon may then be epitaxially deposited on semiconductor substrate 950 or lattice 965 to form a membrane. In the process, a monocrystalline Si layer 955 is grown on the edge of semiconductor substrate 950, and a polycrystalline Si layer 995 is grown on SiC 965 and 990, as shown in FIG. 14c. The transition between monocrystalline region 955 and polycrystalline region 995 is determined by the epitaxy parameters. Angle 999 essentially depends on these parameters. The porous region may be transformed into a cavity region via an annealing step prior to or following the epitaxy operation.

Figure 15A:
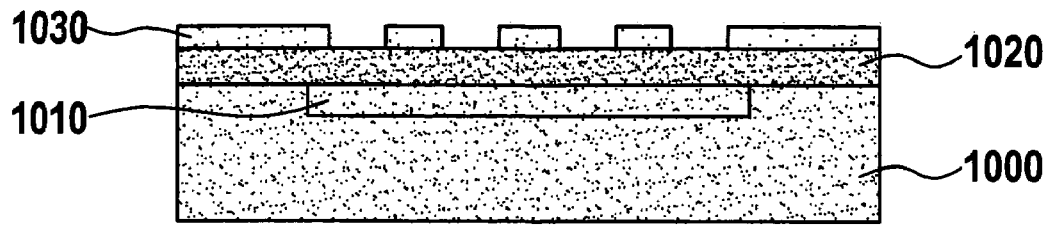
FIGS. 15a-15d show the steps of an example embodiment of a method for producing a lattice and/or a membrane.
Figure 15B:
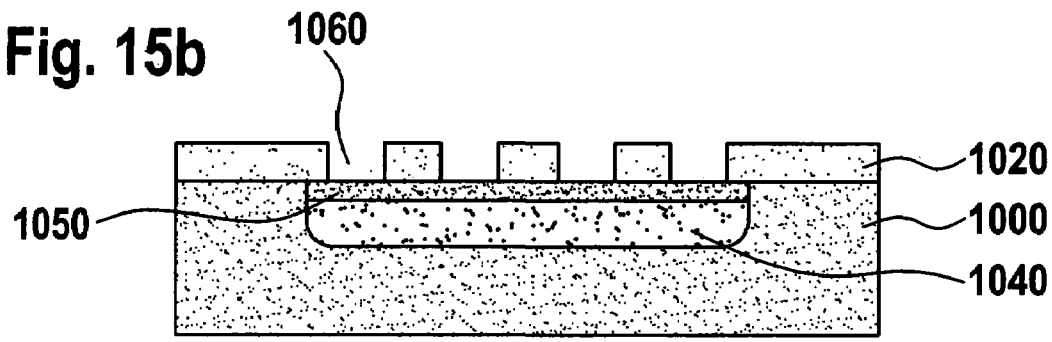

In a further exemplary embodiment, the lattice and membrane production may be accomplished via an additional p+ doping. This additional p+ doping is able to broaden and improve on the method described in published German patent document DE 10 138 759, for instance. As illustrated in FIG. 15a, a layer 1010 having an additional p+ doping is produced on a p− doped semiconductor substrate 1000, such as an Si substrate, prior to semiconductor substrate 1000 and layer 1010 being covered by an n− doped epitaxy layer 1020. N− doped epitaxy layer 1020 may subsequently be patterned by means of an oxide mask 1030, for instance via a trench process. Within the framework of the patterning, holes or trenches 1060 are created in epitaxy layer 1020 via which an anodization process may be implemented in order to produce a (nano)porous, p− doped layer 1040 in semiconductor substrate 1000. Since p+ doped layer 1010 is less susceptible with respect to this anodizing process, a layer 1050 which has meso pores and is located above the layer having nano pores is produced in this region, layer 1050 having lower porosity than layer 1040. In a subsequent annealing process, the material in nanoporous layer 1040 relocates into a cavity, whereas the material in the mesoporous layer 1050 relocates to form a sealed layer. The formation of the sealed layer facilitates both the sealing and the overgrowing of lattice holes 1060 during the following epitaxy and also improves the mechanical stability of the lattice during annealing prior to the epitaxy.

Figure 15C:
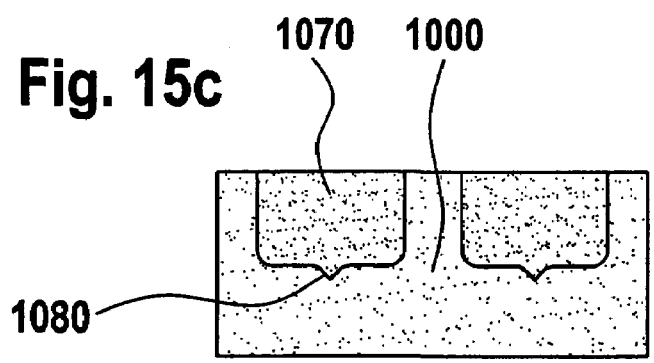
Figure 15D:
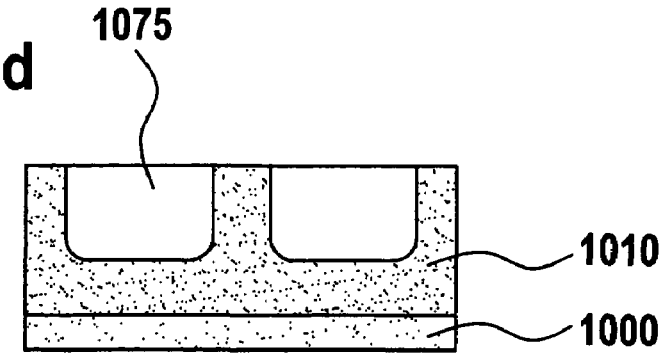

A further advantage of using an additional p+ doping results from a better adaptation of the anodization during the production of the lattice. Without the p+ doping, the p− doped substrate is etched beneath lattice 1070 in an undercut manner in the form of a beak 1080, as illustrated in FIG. 15c. This beak may be reduced or prevented by additional p+ doping 1010, so that a considerably rounder shape will be formed on the underside of lattice webs 1070, as illustrated in FIG. 15d.

It has shown to be especially advantageous if not only semiconductor layer 1000, but p+ doped layer 1010 as well is made of p− doped silicon, and if n− doped layer 1020 is made of silicon. However, the use of other semiconductor materials is conceivable as well.

Figure 16A:
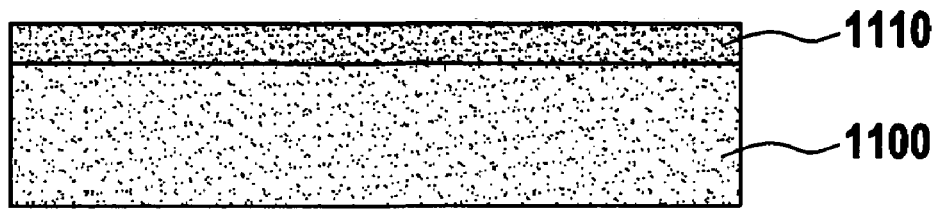
FIGS. 16a-16c show the steps of an example embodiment of a method for producing a lattice and/or a membrane.

Another exemplary embodiment for producing a lattice and/or a membrane on a semiconductor substrate relates to the production of p+ doped regions in an n− doped layer. In the process a planar n− doped (monocrystalline) layer 1100 is first deposited on a p− doped substrate 1100, as shown in FIG. 16a. It is possible here that n− doped layer 1110 is introduced in p− substrate 1100 by means of implantation or by coating or thin epitaxy. P+ doped regions 1120 are then introduced in n− doped layer 1100. This introduction is advantageously implemented by an implantation process in which the p+ doping must be sufficiently strong to locally redope n− doped layer 1110. However, in addition to an implantation process, other methods that produce p+ doped regions 1120 within n− doped layer 1110, may be utilized as well.

Figure 16B:
Figure 16C:
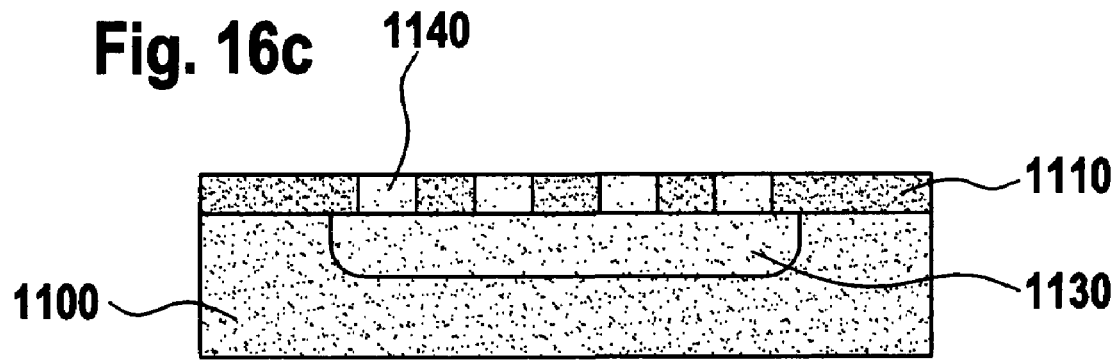

The structure thus produced and illustrated in FIG. 16b may be anodized in a following step, n− doped layer 1110 not being attacked and remaining on substrate 1100 in monocrystalline form. In contrast, local p+ doping 1140 is etched to be rendered porous. If anodizing is implemented for a sufficiently long period of time, both p+ doped regions 1140 and region 1130 are etched to be rendered porous as shown in FIG. 16c, region 1130 being located in p− substrate 1100 underneath p+ doped region 1140. By way of the n− doped regions above region 1130, rendered porous by etching, lattice webs of n− doped material are therefore obtained, between which p+ doped material is located, which is etched to be rendered porous.

Figure 17A:
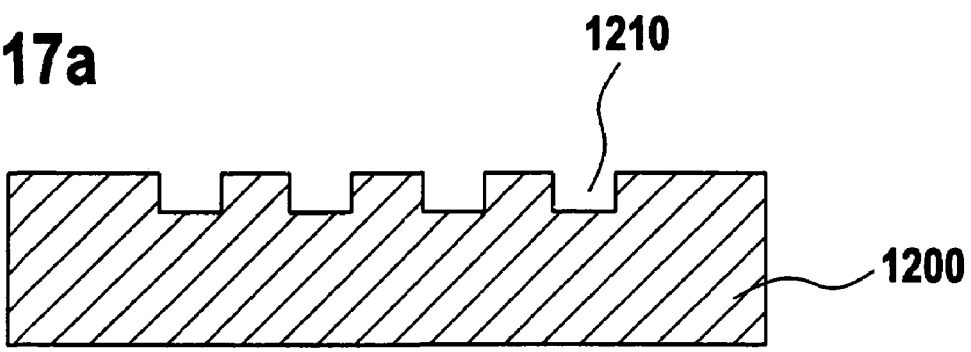
FIGS. 17a-17d show the steps of an example embodiment of a method for producing a lattice and/or a membrane.
Figure 17B:
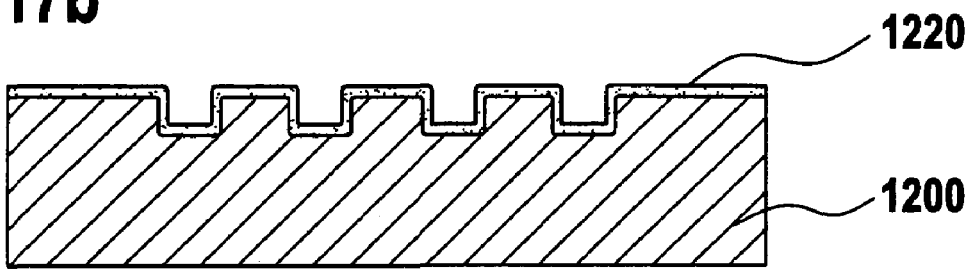
Figure 17C:
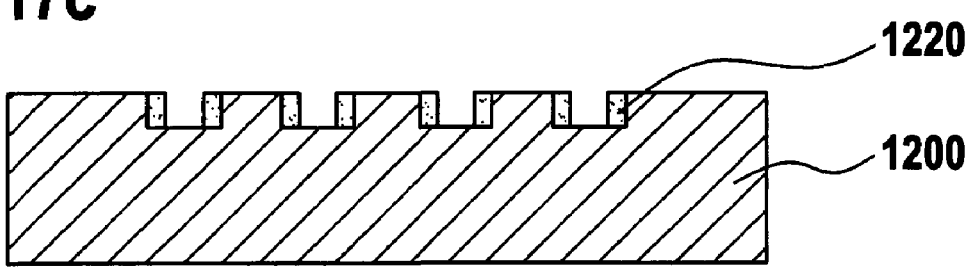

In a further exemplary embodiment (shown in FIGS. 17a through 17d) for producing a monocrystalline lattice on porous semiconductor material, a p− doped substrate 1200 may first be patterned by means of a first patterning. This first patterning essentially defines the later membrane region. The first patterning is advantageously selected such that it has half of the period of the later lattice constant, i.e., the clearance of holes 1210 with respect to each other. An n− doped epitaxy layer 1220 is deposited on p− doped substrate 1200 patterned in this fashion. Naturally, it may also be provided that n− doped layer 1220 be produced directly within substrate 1200 by a diffusion process. A portion of n− doped layer 1220 is subsequently removed by a physical etching step, so that the lattice constant is reduced as illustrated in FIG. 17c by way of example. If the thickness of layer 1220 has been selected appropriately, the lattice constant is able to be halved as a result. Due to the lowering of the lattice constant, a considerably finer structure of the lattice webs or holes 1210 will be obtained on the surface of substrate 1200, so that it is easier for holes 1210 to become overgrown.

Figure 17D:
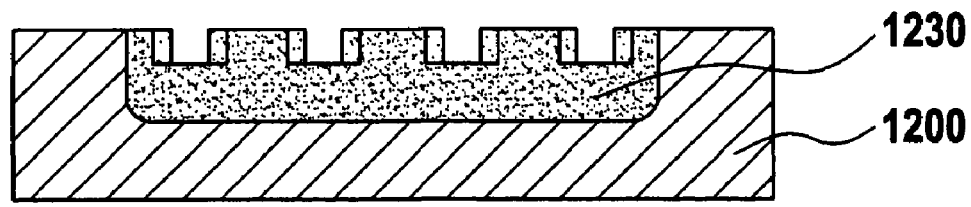

An anodizing process follows, which once again does not attack the n− doping, but renders the p− doping of the substrate porous by etching, ultimately forming a region 1230, which etches the n− doped lattice webs in an undercut manner (FIG. 17d). As already mentioned several times, annealing and/or an epitaxy are/is implemented as final step in the production of the membrane. The annealing relocates the porous semiconductor material in region 1230 and seals the holes between the lattice webs. The actual membrane, on the other hand, is formed by the epitaxy.

Figure 5A:
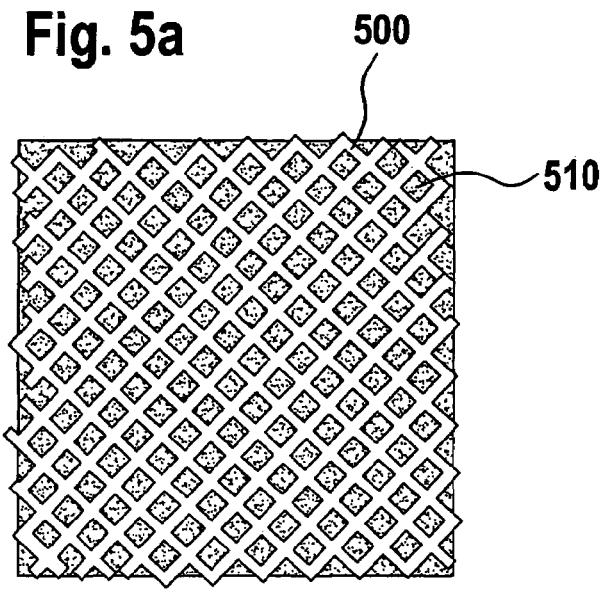
FIGS. 5a-5f illustrate various example embodiments of the webs on which the membrane is deposited according to the present invention.
Figure 5B:
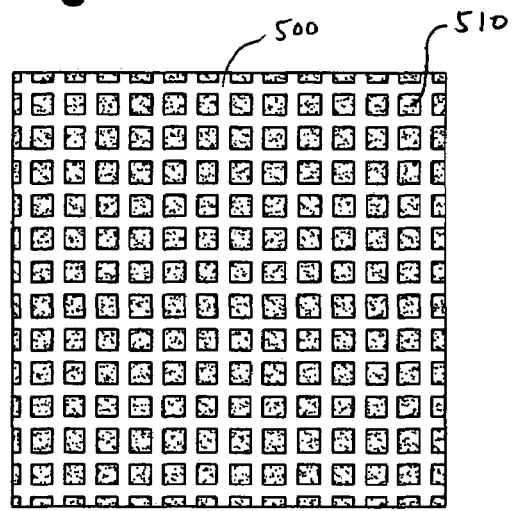
Figure 5C:
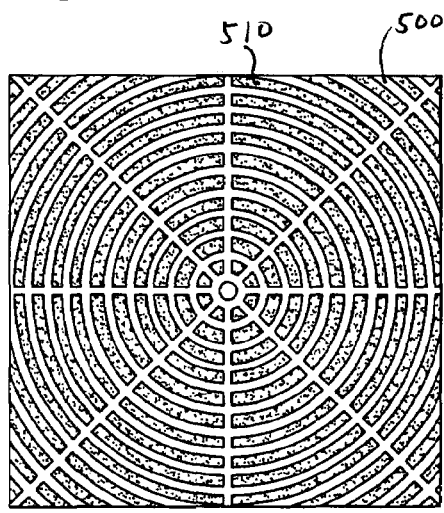
Figure 5D:
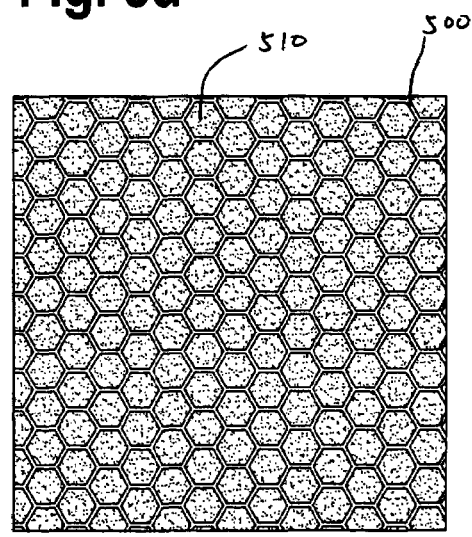
Figure 5E:
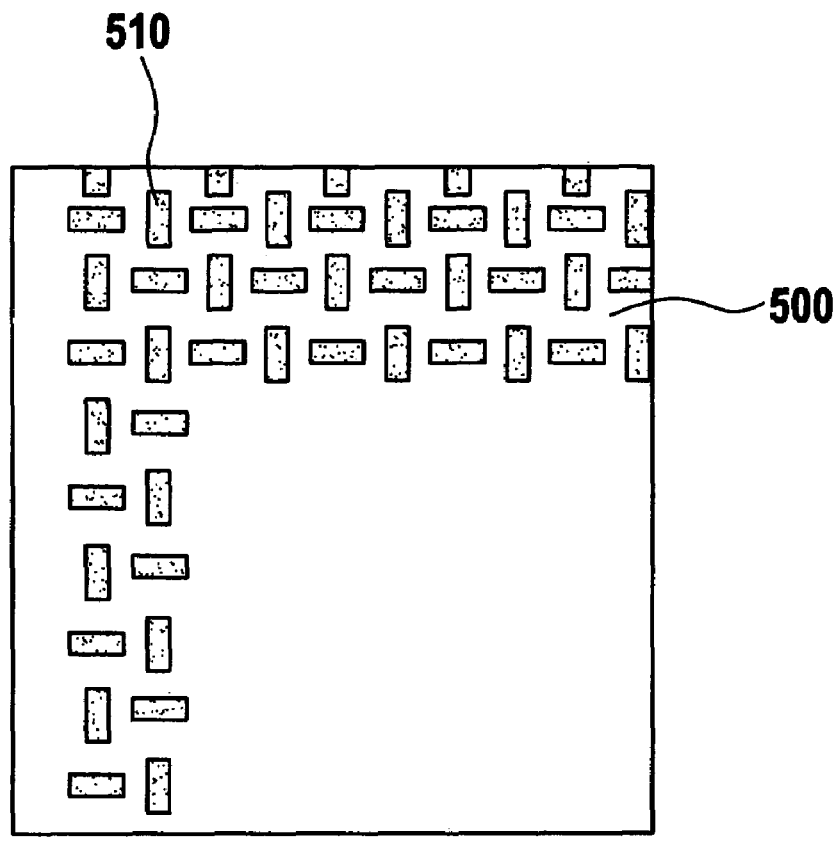
Figure 5F:
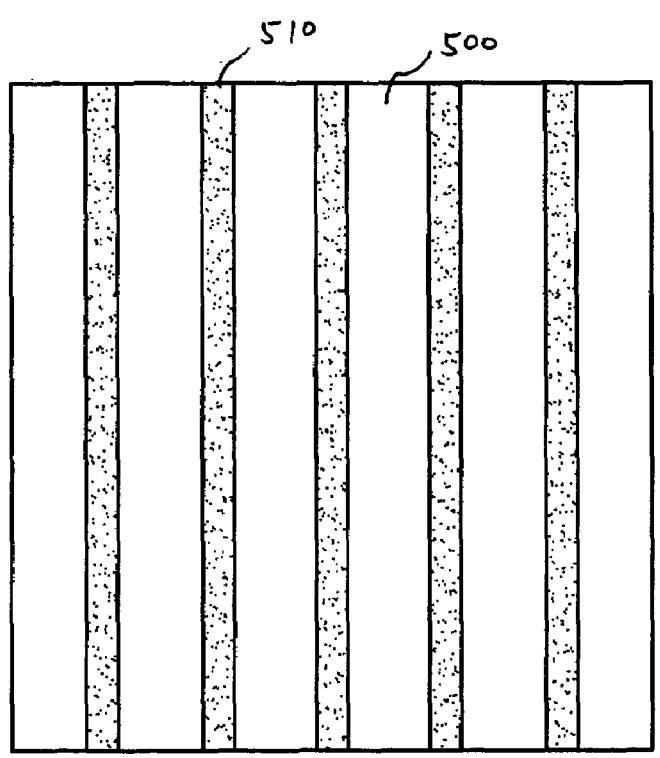

Due to the manner in which the n− doped lattice is produced in this exemplary embodiment, only geometries that form cohesive lattice webs after physical etching may be used, for instance a chessboard-type geometry (see, e.g., FIG. 5e) or a rod-shaped lattice (see, e.g., FIG. 5f).

Silicon is utilized as semiconductor material in the aforedescribed manufacturing method for producing a lattice above a porous layer. It should be noted, however, that materials or semiconductor materials other than silicon, which are able to be rendered porous by etching via an electrochemical method, for instance, may be used in the manufacturing method.

What is claimed is:

1. A method for manufacturing a micromechanical semiconductor element, the method comprising:
    providing a patterned stabilizing element having at least one opening on a semiconductor substrate, the opening allowing access to a first region having a first doping in the semiconductor substrate, wherein the patterned stabilizing element is formed from a first epitaxy layer deposited on the semiconductor substrate;
    selectively removing at least a portion of the first region of the semiconductor substrate;
    providing a membrane above the first region by depositing a second epitaxy layer above the stabilizing element; and
    providing a cavity underneath the stabilizing element from at least a portion of the first region, the stabilizing element having a web above the cavity, wherein the web has a lateral extension that is less than one half of the cavity depth.

2. The method as recited in claim 1, wherein the second epitaxy layer, starting from at least a portion of the stabilizing element, seals the at least one opening above the first region in at least one of lateral and vertical direction, and wherein the second epitaxy layer at least one of substantially covers the stabilizing element and forms the membrane together with the stabilizing element.

3. The method as recited in claim 1, wherein the cavity is directly formed by a thermally induced relocation of semiconductor material in the first region after the membrane has been provided.

4. The method as recited in claim 1, wherein the stabilizing element is formed from the first epitaxy layer by patterning the first epitaxy layer to provide openings via which semiconductor material of the first region is selectively dissolved out, the patterning of the first epitaxy layer including exposing the first epitaxy layer to light at least regionally by a light source and removing at least a portion of the light-exposed first epitaxy layer, and wherein the removal of the light-exposed first epitaxy layer and the selective dissolving out of the semiconductor material from the first region are implemented in the same method step.

5. The method as recited in claim 1, wherein the first epitaxy layer deposited on the semiconductor substrate is patterned with the aid of a passivation layer, and wherein the patterned first epitaxy layer forms interconnected webs above the first region.

6. The method as recited in claim 1, wherein the first epitaxy layer is an SiC layer that is epitaxially applied on the semiconductor substrate and patterned, and wherein the second epitaxy layer is deposited on the patterned SiC layer in a subsequent method step in polycrystalline form.

7. The method as recited in claim 1, wherein the stabilizing element includes at least one of a web above the cavity, a lattice above the cavity, and a framing at the edge of the cavity, and wherein at least one of: a) the stabilizing element includes different vertical extensions above the cavity; and b) the framing has a greater vertical extension than at least one of the lattice and the web.

8. The method as recited in claim 7, wherein a plurality of openings are provided on the stabilizing element, and wherein the rigidity of the membrane is varied by at least one of the arrangement of the plurality of openings on the stabilizing element, a lateral extension of the web, and a vertical extension of the web.

9. The method as recited in claim 7, wherein a cross section of one of the lattice and the web is selected by a mask formed by the first epitaxy layer, and wherein a substantially trapezoid-shaped cross section is provided by the mask.

10. The method as recited in claim 7, wherein at least two implantation steps are provided to form one of the lattice and the web in the surface region of the semiconductor substrate, and wherein, in a second region of the semiconductor substrate, the implantation steps provide one of the lattice and the web with a second doping that is different from the first doping, and only semiconductor material of the first region is dissolved out during the selective removal.

11. The method as recited in claim 10, wherein a third region having a first doping is provided above the first region in the semiconductor substrate having the first doping, the first doping of the third region having a higher doping concentration than the first doping of the first region, and wherein, above the first and the third regions, the first epitaxy layer is provided with a second doping that is different from the first doping, the second epitaxy layer being patterned to provide an access through the second epitaxy layer to the third region, and wherein an etching method that removes only the semiconductor material having the first doping is used for removal of semiconductor material from the first region and the third region, and wherein at least one of: a) more material is removed from the third region compared to the first region, and b) the stabilizing element is produced from the second region.

12. The method as recited in claim 10, wherein the first region has a p doping and at least one of the second region, the lattice, and the web has an n doping.

13. The method as recited in claim 1, wherein the first epitaxy layer is an epitaxy layer having a second doping provided above the first region in the semiconductor substrate having the first doping, and wherein the first epitaxy layer is partially redoped to provide at least a fourth region having the first doping in the first epitaxy layer, and wherein semiconductor material is selectively removed from the first and fourth regions, and wherein at least one of: a) the fourth region has a higher doping concentration compared to the first region, and b) the first and the fourth regions are etched to be rendered porous.

14. The method as recited in claim 1, wherein the surface of the semiconductor substrate is patterned across at least a portion of the first region having the first doping, and wherein the first epitaxy layer having a second doping is provided on the surface of the patterned semiconductor substrate and patterned, the patterned first epitaxy layer forming the stabilizing element, and wherein semiconductor material is selectively dissolved out of the first region, and wherein the second epitaxy layer is produced on the patterned first and second regions.

15. The method as recited in claim 1, wherein the first epitaxy layer has a second doping, and wherein the first and the second dopings are different.

* * * * *